United States Patent
Kim

(10) Patent No.: US 9,153,471 B2
(45) Date of Patent: Oct. 6, 2015

(54) ADHESIVE COMPOSITION FOR A WAFER PROCESSING FILM

(75) Inventor: Jang-Soon Kim, Seongnam-si (KR)

(73) Assignee: LG HAUSYS, LTD., Seoul (KR)

( * ) Notice: Subject to any disclaimer, the term of this patent is extended or adjusted under 35 U.S.C. 154(b) by 0 days.

(21) Appl. No.: 13/980,170

(22) PCT Filed: Mar. 7, 2012

(86) PCT No.: PCT/KR2012/001672
§ 371 (c)(1),
(2), (4) Date: Jul. 17, 2013

(87) PCT Pub. No.: WO2012/121547
PCT Pub. Date: Sep. 13, 2012

(65) Prior Publication Data
US 2013/0295747 A1    Nov. 7, 2013

(30) Foreign Application Priority Data
Mar. 8, 2011 (KR) .................. 10-2011-0020509

(51) Int. Cl.
*H01L 21/00* (2006.01)
*B32B 7/12* (2006.01)
*B32B 15/04* (2006.01)
(Continued)

(52) U.S. Cl.
CPC ........ *H01L 21/6836* (2013.01); *C08G 18/6229* (2013.01); *C09J 7/0217* (2013.01); *C09J 133/066* (2013.01); *C09J 175/04* (2013.01); *C08K 5/23* (2013.01); *C08K 5/33* (2013.01); *C08K 5/42* (2013.01); *C08L 2203/206* (2013.01); *C08L 2312/00* (2013.01); *C09J 2203/326* (2013.01); *C09J 2205/102* (2013.01); *C09J 2205/31* (2013.01); *H01L 2221/68327* (2013.01); *H01L 2221/68381* (2013.01); *Y10T 428/265* (2015.01); *Y10T 428/266* (2015.01); *Y10T 428/2839* (2015.01); *Y10T 428/2891* (2015.01)

(58) Field of Classification Search
USPC ........................................................ 438/464
See application file for complete search history.

(56) References Cited

U.S. PATENT DOCUMENTS 3,474,719 A * 10/1969 Levinos ........................ 430/166
4,093,464 A *  6/1978 Ruckert et al. ............... 430/193
(Continued)

FOREIGN PATENT DOCUMENTS

| CN | 1487039 A | 4/2004 |
|---|---|---|
| EP | 1783820 A1 | 5/2007 |

(Continued)

OTHER PUBLICATIONS

International Search Report mailed Sep. 19, 2012 for PCT/KR2012/001672.
(Continued)

*Primary Examiner* — Brett Feeney
*Assistant Examiner* — Erik T Peterson
(74) *Attorney, Agent, or Firm* — Hauptman Ham, LLP

(57) ABSTRACT

The present invention relates to an adhesive composition for a wafer processing film, a wafer processing film, and a semiconductor wafer processing method. In the semiconductor wafer processing process such as a dicing process or a back grinding process, a delaminating force with respect to a wafer to be attached may be effectively reduced to improve process efficiency and prevent the wafer from being warped or cracked.

16 Claims, 1 Drawing Sheet

(51) Int. Cl.
*H01L 21/683* (2006.01)
*C09J 7/02* (2006.01)
*C09J 133/06* (2006.01)
*C09J 175/04* (2006.01)
*C08G 18/62* (2006.01)
*C08K 5/23* (2006.01)
*C08K 5/33* (2006.01)
*C08K 5/42* (2006.01)

(56) References Cited

U.S. PATENT DOCUMENTS

| | | | | |
|---|---|---|---|---|
| 4,271,260 | A | * | 6/1981 | Abele et al. .................. 430/292 |
| 4,576,893 | A | * | 3/1986 | Nakakita et al. .............. 430/157 |
| 4,842,988 | A | * | 6/1989 | Herrmann et al. ............. 430/14 |
| 4,954,559 | A | * | 9/1990 | Den Hartog et al. ......... 524/507 |
| 5,055,370 | A | * | 10/1991 | Suzuki et al. ............... 430/49.46 |
| 5,240,807 | A | * | 8/1993 | Jain et al. ..................... 430/148 |
| 5,424,165 | A | * | 6/1995 | Sekiya ......................... 430/157 |
| 6,020,108 | A | * | 2/2000 | Goffing et al. ............... 430/306 |
| 2007/0224378 | A1 | | 9/2007 | Takeuchi et al. |
| 2010/0129988 | A1 | | 5/2010 | Ootake et al. |

FOREIGN PATENT DOCUMENTS

| | | | |
|---|---|---|---|
| JP | 03294857 | A | 12/1991 |
| JP | 04328340 | A | 11/1992 |
| JP | 2004107650 | | 4/2004 |
| JP | 2004153052 | A | 5/2004 |
| JP | 2004158812 | | 6/2004 |
| JP | 2006160954 | | 6/2006 |
| JP | 2006-202926 | * | 8/2006 |
| JP | 2006202926 | | 8/2006 |
| JP | 2007254580 | | 10/2007 |
| JP | 2008297337 | A | 12/2008 |
| TW | 587986 | B | 5/2004 |

OTHER PUBLICATIONS

European extended search report dated Sep. 15, 2014.

* cited by examiner

ADHESIVE COMPOSITION FOR A WAFER PROCESSING FILM

TECHNICAL FIELD

The present invention relates to an adhesive composition for a wafer processing film, a wafer processing film, and a semiconductor wafer processing method.

BACKGROUND ART

A wafer processing film is an adhesive film, which is used for securing a wafer in a wafer processing process such as dicing or back-grinding. Generally, such a wafer processing film temporarily secures the wafer in the wafer processing process and is removed from the wafer after the wafer processing process. With rapid progress in miniaturization and weight-reduction of electronic products or home appliances, large-diameter thin-film wafers included in a semiconductor package have been increasingly needed, and for this reason, physical properties of the wafer processing film are of utmost importance.

DISCLOSURE

Technical Problem

An aspect of the present invention is to provide an adhesive composition for a wafer processing film, a wafer processing film, and a semiconductor wafer processing method.

Technical Solution

The present invention relate to an adhesive composition for a wafer processing film which comprises an acrylic polymer and a photosensitive gas generating agent.

Herein, the wafer processing film means an adhesive film used to temporarily secure a wafer during a wafer processing process, such as dicing or back-grinding, or for protecting or reinforcing the wafer.

The acrylic polymer may have a glass transition temperature ($T_g$) of −50° C. to 15° C. If the glass transition temperature of the acrylic polymer is less than −50° C., delamination force can be significantly increased according to a delamination rate. As a result, the delamination force can be excessively increased at a general delamination rate upon delamination of the wafer processing film in the wafer processing process, whereby the wafer can be damaged in the delamination process. Further, if the glass transition temperature of the acrylic polymer exceeds 15° C., decrease in wettability to the wafer and a lifting phenomenon of the wafer can occur.

Further, the acrylic polymer may have a weight average molecular weight ($M_w$) of 50,000 to 1,000,000. Herein, the term "weight average molecular weight" means a converted value with respect to standard polystyrene measured by GPC (Gel Permeation Chromatography). Further, herein, unless otherwise stated, the term "molecular weight" means a weight average molecular weight. If the acrylic polymer has a molecular weight of less than 50,000, contamination due to transfer can occur due to decrease in cohesive strength of the adhesive. If the molecular weight of the acrylic polymer exceeds 1,000,000, adhesive properties of the acrylic polymer can be deteriorated.

As the acrylic polymer, any typical polymer used for manufacturing an adhesive can be used so long as the polymer satisfies the aforementioned properties. In one embodiment, the polymer may include 90 parts by weight to 99.9 parts by weight of a (meth)acrylic acid ester monomer; and 0.1 parts by weight to 10 parts by weight of a copolymerizable monomer having a crosslinkable functional group, in a polymerized form.

As the (meth)acrylic acid ester monomer, for example, alkyl (meth)acrylate may be used. In consideration of cohesive strength, glass transition temperature or adhesion of the adhesive, alkyl(meth)acrylate containing a $C_1$ to $C_{14}$ alkyl group may be used. Example of the monomer may include methyl(meth)acrylate, ethyl(meth)acrylate, n-propyl(meth)acrylate, isopropyl(meth)acrylate, n-butyl(meth)acrylate, t-butyl(meth)acrylate, sec-butyl(meth)acrylate, pentyl(meth)acrylate, 2-ethylhexyl(meth)acrylate, 2-ethylbutyl(meth)acrylate, n-octyl(meth)acrylate, isooctyl(meth)acrylate, isononyl(meth)acrylate, lauryl(meth)acrylate, isobonyl(meth)acrylate, tetradecyl(meth)acrylate, and the like. The polymer may contain at least one of these monomers.

The copolymerizable monomer having a crosslinkable functional group means a monomer which can be copolymerized with the (meth)acrylic acid ester monomer and then provide the crosslinkable functional group to a side chain or end of the copolymer chain. Examples of the crosslinkable functional group may include a hydroxyl group, a carboxyl group, an amide group, a glycidyl group, an isocyanate group, and the like. There are various known copolymerizable monomers having desired crosslinkable functional groups in the art of manufacturing adhesive resins, and all of these monomers may be used in the present invention. Examples of these monomers may include 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 2-hydroxyethylene glycol(meth)acrylate, 2-hydroxypropylene glycol(meth)acrylate, (meth)acrylic acid, 2-(meth)acryloyloxy acetic acid, 3-(meth)acryloyloxy propylic acid, 4-(meth)acryloyloxy butylic acid, acrylic acid dimer, itaconic acid, maleic acid, maleic acid anhydride, (meth)acrylamide, N-vinyl pyrrolidone, N-vinyl caprolactam, and the like. The polymer may contain at least one of these monomers.

The acrylic polymer may include 90 parts by weight to 99.9 parts by weight of the (meth)acrylic acid ester monomer; and 0.1 parts by weight to 10 parts by weight of the copolymerizable monomer having the crosslinkable functional group, in the polymerized form. In this weight ratio, initial adhesive strength, durability, adhesion and cohesive strength of the adhesive can be excellently maintained. Herein, the unit "part by weight" means a weight ratio between the respective components.

In the acrylic polymer, other copolymerizable monomer can be contained in polymerized form, as needed. This copolymerizable monomer may include, for example, a monomer represented by the following Formula 1, and can be used to control glass transition temperature or provide various functionalities to the polymer.

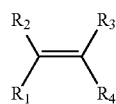

[Formula 1]

wherein $R_1$ to $R_3$ are each independently hydrogen or alkyl, $R_4$ is cyano; phenyl substituted or unsubstituted with alkyl; acetyloxy; or $COR_5$, wherein $R_5$ is amino or glycidyloxy substituted or unsubstituted with alkyl or alkoxy alkyl.

In the definition of $R_1$ to $R_5$ of the above Formula, the alkyl or the alkoxy means a $C_1$ to $C_8$ alkyl or an alkoxy, and preferably means methyl, ethyl, methoxy, ethoxy, propoxy or butoxy.

Specific examples of the monomer in Formula 1 may include at least one of nitrogen-based monomers, such as (meth)acrylonitrile, N-methyl(meth)acrylamide or N-butoxy methyl(meth)acrylamide; styrene-based monomers, such as styrene or methyl styrene; a (meth)acrylic acid ester, such as glycidyl(meth)acrylate; a vinyl ester of carboxylic acid, such as vinyl acetate; and the like, without being limited thereto.

The monomer of Formula 1 may be contained in a ratio of 20 parts by weight or less in the polymer, and can prevent decrease in flexibility or delamination force of the adhesive.

The acrylic polymer may be prepared by any typical method known in the art. For example, the acrylic polymer can be prepared by polymerizing a monomer mixture, which is prepared by mixing required monomers in a desired ratio, through a typical polymerization method, such as solution polymerization, photo polymerization, bulk polymerization, suspension polymerization, or emulsion polymerization. In this case, any suitable polymerization initiator or chain transfer agent may be used together, as needed.

The adhesive composition includes a photosensitive gas generating agent. The term "photosensitive gas generating agent" means, for example, a material capable of generating gas upon exposure to electromagnetic radiation having a certain wavelength range, such as ultraviolet light (UV).

As the photosensitive gas generating agent, a diazo compound or an oxime compound may be used to secure excellent delaminating properties in a semiconductor processing process. Specifically, it is possible to use a diazo compound or oxime compound capable of generating gas when irradiated with light at a wavelength of 200 nm to 400 nm. The diazo compound is a compound that includes two nitrogen atoms and can generate nitrogen ($N_2$) gas when irradiated with light at a wavelength of 200 nm to 400 nm. The oxime compound can generate carbon dioxide ($CO_2$) when irradiated with light at a wavelength of 200 nm to 400 nm. As the oxime compound, an oxime ester-based compound may be used, and specifically, an α-acyloxime ester may be used.

Among these compounds, it is more preferred to use the diazo compound. For example, a diazo-quinone compound may be used as the diazo compound. Specifically, for example, a 2-diazonaphtolsulfonic acid, an ester of 2-diazonaphtolsulfonic acid, or the like may be used. The ester may include an ester with an aromatic compound containing at least one phenolic hydroxyl group. Specifically, the ester may include an ester with a novolac compound, 2,3,4-trihydroxy benzophenone, or 2,3,4,4'-tetrahydroxy benzophenone, without being limited thereto.

In one example, the photosensitive gas generating agent may include at least one selected from the group consisting of 2-diazo-1-naphtol-5-sulfonate, novolac 2-diazo-1-naphtol-5-sulfonate, 2,3,4-trihydroxy benzophenone 2-diazo-1-naphtol-5-sulfonate, 2,3,4,4'-tetrahydroxy benzophenone 2-diazo-1-naphtol-5-sulfonate, and combinations thereof, without being limited thereto.

The adhesive composition may include the photosensitive gas generating agent in an amount of 0.5 parts by weight to 30 parts by weight, preferably 0.5 to 20 parts by weight, more preferably 0.5 parts by weight to 15 parts by weight, based on 100 parts by weight of the acrylic polymer. By controlling the amount of the photosensitive gas generating agent within this range, the adhesive composition can provide excellent delaminating properties in a semiconductor processing process. However, the amount of the gas generating agent is exemplary, and the amount of the gas generating agent can be properly changed in light of the amount of gas which can be produced per molecule, desired delaminating properties, and the like.

Also, the adhesive composition may further include a polyfunctional crosslinking agent. The polyfunctional crosslinking agent may control adhesive properties of the adhesive according to the amount of the polyfunctional crosslinking agent. According to circumstance, the polyfunctional crosslinking agent reacts with the crosslinkable functional group contained in the acrylic polymer, thereby improving cohesive strength of the adhesive.

As the polyfunctional crosslinking agent, any typical crosslinking agent known in the art may be used, for example, isocyanate crosslinking agents, epoxy crosslinking agents, aziridine crosslinking agents, metal chelate crosslinking agents, and the like.

Examples of isocyanate crosslinking agents may include, but not limited to, diisocyanate compounds, such as tolylene diisocyanate, xylene diisocyanate, diphenylmethane diisocyanate, hexamethylene diisocyanate, isophorone diisocyanate, tetramethylxylene diisocyanate, naphthalene diisocyanate and the like, or crosslinking agents formed by reacting the diisocyanate compounds with polyol, wherein the polyol may include trimethylol propane and the like, without being limited thereto. Further, examples of epoxy crosslinking agents may include ethylene glycol diglycidyl ether, triglycidyl ether, trimethylol propane triglycidyl ether, N,N,N',N'-tetraglycidyl ethylene diamine, and glycerin diglycidyl ether, without being limited thereto. Examples of aziridine crosslinking agents may include N,N'-toluene-2,4-bis(1-aziridinecarboxamide), N,N'-diphenylmethane-4,4'-bis(1-aziridinecarboxamide), triethylenemelamine, bisisophthaloyl-1-(2-methylaziridine), and tri-1-aziridinyl phosphine oxide, without being limited thereto. Examples of metal chelate crosslinking agents may include acetyl acetone or acetoacetic acid ethyl coordinated with at least one polyvalent metal, such as aluminum, iron, zinc, tin, titanium, antimony, magnesium, and vanadium, without being limited thereto.

The polyfunctional crosslinking agent may be contained in an amount of 0.1 parts by weight to 10 parts by weight, based on 100 parts by weight of the acrylic polymer. If the amount of the crosslinking agent is less than 0.1 parts by weight, cohesive strength of the adhesive can be decreased, thereby causing cohesive failure at high temperature or high humidity. If the amount of the crosslinking agent exceeds 10 parts by weight, durability can be decreased, causing delamination between layers or a lifting phenomenon, or compatibility or fluidity can be decreased.

Within a range that does not negatively influence the effects of the present invention, the adhesive composition may further include at least one additive selected from the group consisting of tackifier resins, initiators, low molecular weight materials, epoxy resins, curing agents, ultraviolet light stabilizers, antioxidants, coloring agents, reinforcing agents, defoaming agents, surfactants, foaming agents, organic salts, thickening agents, and flame retardants.

The present invention also relates to a wafer processing film comprising a substrate; and an adhesive layer formed on one or both sides of the substrate and having the acrylic polymer and the photosensitive gas generating agent.

FIG. 1 is a sectional view of one example of a wafer processing film, which includes an adhesive layer 10 on a substrate 20.

As the substrate of the wafer processing film, for example, a film or a sheet having a toughness value of less than 240 Kg·mm, preferably 210 Kg·mm or less, more preferably 50

Kg·mm to 150 Kg·mm, which is measured at a temperature of 23° C., preferably 20° C. to 25° C., more preferably 15° C. to 30°, is user.

The term "toughness value" is a physical property of a film measured by tensile testing, and is a value indicating the degree of hardness and softness of the film. For example, the toughness value can be measured by the following method. First, a specimen for measuring a toughness value is prepared. At this time, the specimen may be, for example, in the form of a film having a size of 15 mm in length and 15 mm in width. The size of the specimen means the size of a portion except that is taped to secure the specimen for testing. The specimen is installed and fixed to a tensile tester such that a longitudinal direction of the specimen is perpendicular to the direction of a tester. A graph of force measured according to distance until the specimen is fractured is drawn while stretching the specimen in the longitudinal direction at a tensile rate of 180 mm/min to 220 mm/min, preferably 200 mm/min. The toughness value of the specimen can be measured by applying the area and the thickness of the specimen to the drawn graph to draw a graph of elongation and tensile strength (X axis: elongation, Y axis: tensile strength) and integrating the graph to calculate the area.

Elastic modulus and fracturability of the substrate can be properly maintained by controlling the toughness value of the substrate to less than 240 Kg·mm. Further, stress added during the wafer processing process can be released, processing precision can be increased, and the wafer can be effectively protected by maintaining cushioning properties of the substrate.

Further, in light of efficiency of the wafer processing process, the substrate may have a storage modulus of $1 \times 10^7$ Pa to $1 \times 10^9$ Pa at a temperature of $-10°$ C. to $100°$ C., preferably about 20° C.

The kind of the substrate is not particularly limited, and for example, a film or sheet prepared of a material such as synthetic rubber, synthetic resin or natural resin, may be used. Specifically, the substrate may includes, for example, one or more of olefin sheets, such as PE (poly(ethylene)) or PP (poly(propylene)) sheets; ethylene vinyl acetate (EVA) sheets; copolymer sheets of ethylene and alkyl(meth)acrylate having a $C_1$ to $C_4$ alkyl group; copolymer sheets of ethylene and α-olefin; copolymer sheets of propylene and α-olefin; polyester sheets, such as polyethylene terephthalate (PET) or polybutylene terephthalate (PBT) sheets; polyvinyl chloride (PVC) sheets, elastomer sheets, urethane sheets, and the like. Here, the two or more substrates may mean a film or sheet, which is formed by laminating two or more kinds of the aforementioned substrates, or manufactured from a blend of two or more of the aforementioned resins. The substrate can be manufactured by any typical method known in the art. A representative manufacturing method may include, for example, T-die extrusion, inflation, calendering, and the like, without being limited thereto.

Thickness of the substrate may be properly selected depending on purpose, and is not particularly limited. For example, the substrate may have a suitable thickness ranging from 10 μm to 500 μm, preferably from 50 μm to 300 μm.

Also, in view of improving adhesion to the adhesive layer, surface treatment such as primer treatment or corona treatment may be performed on the substrate, and a suitable color may also be added for process efficiency.

The adhesive layer formed on one or both sides of the substrate may be formed by curing the adhesive composition described above. Curing is a process by which the adhesive composition is changed into a state in which the adhesive composition exhibits adhesive properties through a process, such as irradiation with electromagnetic radiation or maintenance at proper temperature.

A method for forming the adhesive layer is not particularly limited. For example, the method may include a method of applying the adhesive composition to the substrate and curing the adhesive composition, or a method of applying the adhesive composition to a releasable substrate and curing the adhesive composition to form an adhesive layer, followed by transferring the adhesive layer to the substrate. The method of applying the adhesive composition to a surface of the substrate or releasable substrate is not particularly limited. For example, this method can be performed by a process, such as bar coating, knife coating, roll coating, spray coating, gravure coating, curtain coating, comma coating, or lip coating. Further, the method of curing the adhesive composition is also not particularly limited, and any typical heat-curing method or photo-curing method may be employed.

In the formation of the adhesive layer, it is preferred to control the crosslinking structure of the adhesive layer through a proper drying and aging process. That is, the acrylic polymer in the adhesive layer can be present in a crosslinking state by the polyfunctional crosslinking agent. Through control of the crosslinking structure, the adhesive layer having elasticity and strong cohesive strength can be obtained, and therefore, adhesive properties, such as endurance reliability, and fracturability of the film can be improved. Specifically, the adhesive layer of the film may have a crosslinking density of 80% to 99%. If the crosslinking density of the adhesive layer is less than 80%, cohesive strength of the adhesive layer can be reduced, and the adhesive layer components are transferred to the wafer and remain as residues. Further, if the crosslinking density of the adhesive layer exceeds 99%, delamination force can be reduced, whereby water immersion due to water spray can occur upon wafer processing.

The crosslinking density is a value obtained by the following Expression 1.

$$\text{Crosslinking Density} = B/A \times 100 \qquad \text{[Expression 1]}$$

In Expression 1, A is a mass of the cured adhesive composition, and B is a dry mass of undissolved powder collected after curing the mass A and depositing the adhesive composition in ethyl acetate at room temperature for 48 hours.

The adhesive layer preferably has a thickness of 0.5 μm to 50 μm, more preferably 1 μm to 30 μm. If the thickness of the adhesive layer is not within this range, it is difficult to obtain a uniform adhesive layer, such that the film can have non-uniform properties.

Further, in order to prevent foreign materials from being introduced into the adhesive layer, the film may further include a delaminating film attached to the adhesive layer. FIG. 2 is a sectional view of one example of the film, wherein an adhesive layer 10 is formed on one side of a substrate 20, and a delaminating film 30 is formed on the adhesive layer 10. As the delaminating film, for example, a polyester film such as a PET film or a film prepared by release-treating one or both sides of an olefin film using a silicone or alkyd release agent may be used. The thickness of the delaminating film may be properly set depending on purpose, and is not particularly limited. For example, the film may have a thickness ranging from 10 μm to 70 μm.

In addition, the present invention relates to a semiconductor wafer processing method which includes attaching a wafer processing film to a semiconductor wafer; processing the semiconductor wafer with the wafer processing film attached thereto; and irradiating the wafer processing film with ultraviolet light.

In this method, for example, the film is attached to the wafer by pressing or hot-roll laminating, and then wafer processing process is performed. The kind of the wafer processing process is not particularly limited, and as the representative example, the wafer processing process may include a dicing process or a back-grinding process. Conditions for performing a dicing process or a back-grinding process are not particularly limited, and any condition typically used in the art may be properly selected.

After the processing process, the adhesive layer is irradiated with ultraviolet light. The adhesive layer includes the photosensitive gas generating agent, so that gas is generated inside of the adhesive layer by ultraviolet light irradiation. Volume of the adhesive layer is expanded by the generated gas, and therefore, the delamination force of the wafer and the adhesive layer is effectively reduced, whereby the subsequent delamination process can be effectively performed.

Conditions of the ultraviolet light irradiation are not particularly limited so long as the gas generating agent contained in the adhesive layer can generate enough gas and delamination force can be effectively reduced. For example, ultraviolet light having a wavelength of 200 nm to 400 nm and a light intensity of 5 mW/cm$^2$ to 200 mW/cm$^2$ may be radiated for about 5 seconds to about 60 seconds, preferably about 10 seconds to 30 seconds.

The method may further include delaminating the semiconductor wafer from the wafer processing film after ultraviolet light irradiation.

After passing through the UV light irradiation process, the adhesive layer is expanded, thereby reducing adhesion to the wafer. Accordingly, delamination of a protective film from the wafer may be easily performed.

Advantageous Effects

In the present invention, delamination force with respect to an adherend, that is, a wafer, can be effectively reduced in a semiconductor wafer processing process, such as a dicing process or a back-grinding process. Accordingly, an adhesive composition for a wafer processing film, a wafer processing film and a semiconductor wafer processing method, which can enhance process efficiency and prevent damage of the wafer such as bending or cracking, may be provided.

BEST MODE

Figure 1:
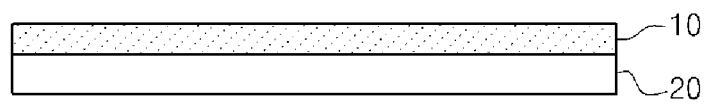
FIGS. 1 and 2 are sectional views of exemplary wafer processing films according to the present invention.
Figure 2:
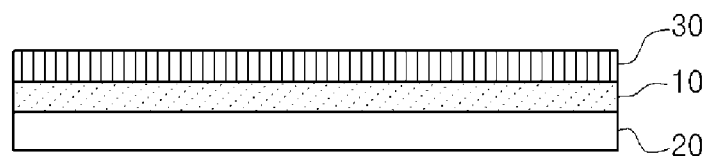

Hereinafter, the present invention will be described in detail with reference to examples and comparative examples. However, it should be understood that the present invention is not limited to the following examples.

PREPARATIVE EXAMPLE 1

Preparation of Acrylic Polymer 65 parts by weight of ethylhexyl acrylate (EHA), 15 parts by weight of ethyl acrylate (EA), 17.5 parts by weight of methyl acrylate (MA) and 2.5 parts by weight of hydroxyethyl acrylate (HEA) were diluted in a solvent, and polymerized under proper conditions to obtain an acrylic polymer having a glass transition temperature of −36.2° C., a molecular weight of 800,000, a molecular weight distribution (PDI) of 3.12, and a solid content of 20%.

EXAMPLE 1

Based on 100 parts by weight of the prepared acrylic polymer, 1 part by weight of novolac 2-diazo-1-naphtol-5-sulfonate (MIPHOTOPAC 100, Miwon Commercial Co., Ltd.) diluted in ethyl acetate to a concentration of 10 wt % and 0.5 parts by weight of isocyanate-based crosslinking agent were added and mixed at 300 to 400 rpm for 1 hour to obtain a coating solution. The prepared coating solution was applied to a 38 μm thick PET release film such that the thickness of the coating layer after drying was 10 μm, and dried at 110° C. for 3 minutes. Then, the dried coating layer was transferred to an 80 μm thick PET film, and left at 40° C. for 24 hours to obtain a wafer processing film.

Examples 2 to 18 and Comparative Example 1

Wafer processing films were manufactured in the same manner as in Example 1, except that the components for preparing a coating solution were changed, as shown in Tables 1, 2 and 3.

TABLE 1

| | | Example | | | | | |
|---|---|---|---|---|---|---|---|
| | | 2 | 3 | 4 | 5 | 6 | 7 |
| Acrylic Polymer | | 100 | 100 | 100 | 100 | 100 | 100 |
| Isocyanate Crosslinking Agent | | 0.5 | 0.7 | 1.0 | 1.5 | 0.7 | 0.7 |
| Photosensitive gas | A1 | 5.0 | 1.0 | 1.0 | 1.0 | — | — |
| generating agent | A2 | — | — | — | — | 10.0 | 5.0 |

A1: novolac 2-diazo-1-naphtol-5-sulfonate (MIPHOTOPAC 100)
A2: 2,3,4,4'-tetrahydroxy benzophenone 2-diazo-1-naphtol-5-sulfonate (MIPHOTOPAC 435)

TABLE 2

| | | Example | | | | | Comparative Example |
|---|---|---|---|---|---|---|---|
| | | 8 | 9 | 10 | 11 | 12 | 1 |
| Acrylic Polymer | | 100 | 100 | 100 | 100 | 100 | 100 |
| Isocyanate Cross-linking Agent | | 0.7 | 0.7 | 1.0 | 1.5 | 1.0 | 0.5 |
| Photosensitive Gas | A1 | — | — | — | — | — | — |
| Generating Agent | A2 | 10.0 | 5.0 | 10.0 | 10.0 | 5.0 | — |

A1: novolac 2-diazo-1-naphtol-5-sulfonate (MIPHOTOPAC 100)
A2: 2,3,4,4'-tetrahydroxy benzophenone 2-diazo-1-naphtol-5-sulfonate (MIPHOTOPAC 435)

TABLE 3

| | | Example | | | | | |
|---|---|---|---|---|---|---|---|
| | | 13 | 14 | 15 | 16 | 17 | 18 |
| Acrylic Polymer | | 100 | 100 | 100 | 100 | 100 | 100 |
| Isocyanate Crosslinking Agent | | 1.0 | 1.5 | 0.7 | 1.0 | 1.5 | 0.7 |
| Photosensitive Gas | A3 | 1.0 | 1.0 | 10.0 | — | — | — |
| Generating Agent | A4 | — | — | — | 1.0 | 1.0 | 10.0 |

A3: α-acyloxime ester
A4: 2,2'-Azobis(N-buty-2-methylpropionamide) (produced by Waco pure chemical)

1. Measuring of Delamination Force Before UV Irradiation

The wafer processing film prepared in each of the inventive examples and the comparative example was cut into a specimen having a width of 25 mm and a length of 10 cm. The prepared specimen was laminated on a wafer at room temperature, in which a polyimide layer was formed to a thickness of 1 μm on the surface thereof. The laminated state was maintained for 20 min, and the delamination force was measured while the wafer processing film was delaminated at a delamination rate of 300 m/min and a delamination angle of 90 degrees using a tensile tester.

2. Measuring of Delamination Force After UV Irradiation

An adhesive layer of the same specimen used for measuring the delamination force before UV irradiation was irradiated with ultraviolet light of UV-A region using a mercury lamp for 15 seconds (100 mW/cm$^2$), and the delamination force was measured by the same method as the measuring of the delamination force before UV irradiation.

Measured results are listed in Table 4.

TABLE 4

| | Delamination force Before UV Irradiation (Unit: g/25 mm) | Delamination force After UV Irradiation (Unit: g/25 mm) |
|---|---|---|
| Example 1 | 567 | 483 |
| Example 2 | 563 | 523 |
| Example 3 | 398 | 363 |
| Example 4 | 218 | 199 |
| Example 5 | 143 | 159 |
| Example 6 | 763 | 49 |
| Example 7 | 778 | 461 |
| Example 8 | 812 | 94 |
| Example 9 | 768 | 35 |
| Example 10 | 515 | 186 |
| Example 11 | 167 | 130 |
| Example 12 | 155 | 86 |
| Example 13 | 451 | 394 |
| Example 14 | 410 | 321 |
| Example 15 | 511 | 309 |
| Example 16 | 651 | 533 |
| Example 17 | 531 | 512 |
| Example 18 | 601 | 578 |
| Comparative Example 1 | 653 | 663 |

As shown in Table 4, it could be seen that, in the case of the inventive examples using the gas generating agent, the delamination force was effectively reduced as compared with the comparative example not using the gas generating agent. Further, it could be seen that the delamination force was more effectively reduced in Examples 1 to 15 using the diazoquinone or the oxime compound as the gas generating agent than in Examples 16 to 18 using the azobis compound as the gas generating agent.

The invention claimed is:

1. An adhesive composition for a wafer processing film, the composition comprising:
   an acrylic polymer; and
   a photosensitive gas generating agent,
   wherein the photosensitive gas generating agent comprises an ester of 2-diazonaphtolsulfonic acid; and
   wherein the photosensitive gas generating agent comprises at least one selected from the group consisting of novolac 2-diazo-1-naphthol-5-sulfonate, 2,3,4-trihydroxy benzophenone 2-diazo-1-naphthol-5-sulfonate, and 2,3,4,4'-tetrahydroxy benzophenone 2-diazo-1-naphthol-5-sulfonate.

2. The adhesive composition according to claim 1, wherein the acrylic polymer has a glass transition temperature of −50° C. to 15° C.

3. The adhesive composition according to claim 1, wherein the acrylic polymer has a weight average molecular weight of 50,000 to 1,000,000.

4. The adhesive composition according to claim 1, wherein the acrylic polymer comprises:
   90 parts by weight to 99.9 parts by weight of a (meth) acrylic acid ester monomer; and
   0.1 part by weight to 10 parts by weight of a copolymerizable monomer having a crosslinkable functional group, in a polymerized form.

5. The adhesive composition according to claim 4, wherein the crosslinkable functional group comprises a hydroxyl group, a carboxyl group, an amide group, a glycidyl group, or an isocyanate group.

6. The adhesive composition according to claim 1, wherein the photosensitive gas generating agent is present in an amount of 0.5 parts by weight to 30 parts by weight based on 100 parts by weight of the acrylic polymer.

7. The adhesive composition according to claim 1, further comprising:
   a polyfunctional crosslinking agent.

8. A wafer processing film, comprising:
   a substrate; and
   an adhesive layer formed on one or both sides of the substrate and comprising an acrylic polymer and a photosensitive gas generating agent,
   wherein the photosensitive gas generating agent comprises an ester of 2-diazonaphtolsulfonic acid; and
   wherein the photosensitive gas generating agent comprises at least one selected from the group consisting of novolac 2-diazo-1-naphthol-5-sulfonate, 2,3,4-trihydroxy benzophenone 2-diazo-1-naphthol-5-sulfonate, and 2,3,4,4'-tetrahydroxy benzophenone 2-diazo-1-naphthol-5-sulfonate.

9. The wafer processing film according to claim 8, wherein the substrate has a thickness of 10 μm to 500 μm.

10. The wafer processing film according to claim 8, wherein the adhesive layer has a thickness of 0.5 μm to 50 μm.

11. The wafer processing film according to claim 8, further comprising:
   a release film formed on the adhesive layer.

12. A method of processing a semiconductor wafer, comprising:
   attaching the wafer processing film according to claim 8 to a semiconductor wafer;
   processing the semiconductor wafer to which the wafer processing film is attached; and
   irradiating the wafer processing film with ultraviolet light.

13. The method according to claim 12, wherein the processing the semiconductor wafer comprises a dicing process or a back-grinding process.

14. The method according to claim 12, wherein the irradiating the wafer processing film with ultraviolet light is performed by radiating ultraviolet light at a wavelength of 200 nm to 400 nm and a light intensity of 5 mW/cm$^2$ to 200 mW/cm$^2$ for 5 seconds to 60 seconds.

15. The method according to claim 12, further comprising:
   delaminating the semiconductor wafer from the wafer processing film after the ultraviolet light radiation.

16. The wafer processing film according to claim 8, wherein the adhesive layer has a gel content of 80% to 99%,
   wherein the gel content is a value obtained by the following Expression 1:

$$\text{Gel content (\%)} = B/A \times 100, \quad \text{[Expression 1]}$$

where
   A is a mass of a cured adhesive composition, and

B is a dry mass of undissolved powder collected after curing the adhesive composition and 48 hours at room temperature after depositing the adhesive composition.

* * * * *